(12) United States Patent
Koo

(10) Patent No.: US 9,007,114 B2
(45) Date of Patent: Apr. 14, 2015

(54) SEMICONDUCTOR DEVICE INCLUDING CLOCK SIGNAL GENERATION UNIT

(71) Applicant: Samsung Electronics Co., Ltd, Suwon-si, Gyeonggi-do (KR)

(72) Inventor: Kyunghoi Koo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/155,692

(22) Filed: Jan. 15, 2014

(65) Prior Publication Data

US 2014/0253178 A1 Sep. 11, 2014

(30) Foreign Application Priority Data

Mar. 11, 2013 (KR) .................. 10-2013-0025716

(51) Int. Cl.
*H03K 3/00* (2006.01)
*G06F 1/04* (2006.01)
*H03K 5/02* (2006.01)
*H03K 5/24* (2006.01)

(52) U.S. Cl.
CPC ... *H03K 5/02* (2013.01); *H03K 5/24* (2013.01)

(58) Field of Classification Search
USPC .............................. 327/291; 326/30; 365/193
See application file for complete search history.

(56) References Cited

U.S. PATENT DOCUMENTS

| | | | |
|---|---|---|---|
| 4,529,891 A | 7/1985 | Oida | |
| 4,795,922 A | 1/1989 | Rice et al. | |
| 4,890,073 A | 12/1989 | Flachenecker et al. | |
| 6,157,263 A | 12/2000 | Lee et al. | |
| 6,611,222 B1 | 8/2003 | Murphy | |
| 6,700,438 B2 * | 3/2004 | Chang et al. | 327/562 |
| 7,439,761 B2 * | 10/2008 | Mayer et al. | 326/30 |
| 7,515,486 B2 * | 4/2009 | Seo et al. | 365/189.05 |
| 7,663,397 B2 * | 2/2010 | Yang et al. | 326/30 |
| 7,746,098 B2 * | 6/2010 | Heath et al. | 326/30 |
| 7,843,213 B1 * | 11/2010 | Linder et al. | 326/30 |
| 7,999,572 B2 * | 8/2011 | Komyo et al. | 326/58 |
| 8,027,391 B2 | 9/2011 | Matsubara et al. | |
| 8,139,688 B1 | 3/2012 | Wu et al. | |
| 8,149,017 B2 | 4/2012 | Knierim | |
| 8,638,622 B2 * | 1/2014 | Wang et al. | 365/193 |

FOREIGN PATENT DOCUMENTS

| | | |
|---|---|---|
| JP | 58-166855 | 10/1983 |
| JP | 63-263920 | 10/1988 |
| KR | 10-0200501 | 3/1999 |
| KR | 10-0202173 | 3/1999 |
| KR | 10-0326213 | 2/2002 |
| KR | 2010-0079714 | 7/2010 |

* cited by examiner

*Primary Examiner* — Kenneth Wells
(74) *Attorney, Agent, or Firm* — Ellsworth IP Group PLLC

(57) ABSTRACT

A semiconductor device for stably generating a clock signal from a strobe signal includes a processor, a clock signal generation unit receiving a first strobe signal and a second strobe signal to generate the clock signal, and a data reception unit receiving at least one data signal to provide the received data signal to the processor. The clock signal generation unit may comprise a strobe comparator comparing a voltage of a first input terminal with that of a second input terminal to output logic high or logic low, a first switch selectively connecting one of a first and a second signal line to the first input terminal, a second switch selectively connecting one of the second signal line and a reference line to the second input terminal, and a voltage stabilizing circuit pulling up/down at least one of a voltage of the first and the second signal line.

19 Claims, 14 Drawing Sheets

SEMICONDUCTOR DEVICE INCLUDING CLOCK SIGNAL GENERATION UNIT

CROSS-REFERENCE TO RELATED APPLICATIONS

This U.S. non-provisional patent application claims the benefit of priority under 35 U.S.C. §119 from Korean Patent Application No. 10-2013-0025716, filed on Mar. 11, 2013, the entire contents of which are hereby incorporated by reference.

BACKGROUND

1. Field

The present general inventive concept herein relates to semiconductor devices, and more particularly, to a semiconductor device including a clock signal generation unit which receives a differential signal to generate a clock signal.

2. Description of the Related Art

To drive a semiconductor device, an internal clock signal (hereinafter referred to as a clock signal) may be generated by using an external clock signal (hereinafter referred to as a strobe signal) being transmitted from a controller to read received data according to the generated clock signal. Specifically, a differential signal may be used as the strobe signal to minimize electrical interference from external sources.

Using the differential signal as the strobe signal helps prevent external electrical interference, but has a disadvantage in that a received strobe signal cannot be read when levels of two signals constituting a differential signal are the same due to transmission errors. Furthermore, when a high impedance signal is transmitted as a strobe signal, a received strobe signal may not be able to normally be read. A technology of weakly pulling up/pulling down a strobe signal may be used in preparation for receiving a high impedance signal, but the weak pull-up/pull-down technology has a relatively slow reaction velocity and thereby is not suitable for a pull-up/pull-down of a high frequency signal.

SUMMARY

Features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a semiconductor device, including a processor, a clock signal generation unit to receive a first strobe signal and a second strobe signal to generate a clock signal to be provided to the processor, and a data reception unit to receive at least one data signal to provide the received data signal to the processor, wherein the clock signal generation unit may comprise a strobe comparator to compare a voltage of a first input terminal with a voltage of a second input terminal to output logic high or logic low according to the result of comparison, a first switch to selectively connect one of a first signal line by which the first strobe signal is transmitted and a second signal line by which the second strobe signal is transmitted, to the first input terminal, a second switch to selectively connect one of the second signal line and a reference line by which a reference voltage is provided from the data reception unit, to the second input terminal, and a voltage stabilizing circuit to pull up or pull down a voltage of the first signal line or a voltage of the second signal line.

The strobe comparator may output logic high or logic low when a difference between the voltage of the first input terminal and the voltage of the second input terminal is greater than a predetermined value.

The voltage stabilizing circuit may comprise a termination pull-up/pull-down unit to pull up at least one of the voltage of the first signal line and the voltage of the second signal line through a termination pull-up resistor having a predetermined resistance value, or to pull down at least one of the voltage of the first signal line and the voltage of the second signal line through a termination pull-down resistor having a predetermined resistance value.

The termination pull-up/pull-down unit may comprise a first pull-up switch to provide a pull-up voltage to the first signal line.

The termination pull-up/pull-down unit may further comprise a first pull-down switch to provide a pull-down voltage to the first signal line.

The first pull-up switch and the first pull-down switch may be complementarily turned on.

The second switch may connect the second signal line to the second input terminal when the reference line is not connected to the second input terminal.

The first switch may connect the first signal line to the first input terminal when the second signal line is connected to the second input terminal.

The termination pull-up/pull-down unit may further comprise a second pull-up switch to provide a pull-up voltage to the second signal line.

The voltage stabilizing circuit may control turn-on/turn-off of the first pull-up switch and the second pull-up switch in response to a control signal provided from the processor.

The voltage stabilizing circuit may further comprise a weak pull-up/pull-down unit pulling up at least one of the voltage of the first signal line and the voltage of the second signal line through a weak pull-up resistor having a different predetermined resistance value from the termination pull-up resistor, or pulling down at least one of the voltage of the first signal line and the voltage of the second signal line through a weak pull-down resistor having a different predetermined resistance value from the termination pull-down resistor.

The voltage stabilizing circuit may pull up or pull down at least one of the voltage of the first signal line and the voltage of the second signal line by using one of the termination pull-up/pull-down unit and the weak pull-up/pull-down unit according to a predetermined operation mode.

The clock signal generation unit may further comprise a strobe buffer to buffer an output of the strobe comparator to provide the buffered output to the processor as the clock signal.

The processor may sample a data signal provided from the data reception unit, according to the clock signal.

The foregoing and/or other features and utilities of the present general inventive concept may also be achieved by providing a semiconductor device including a processor, a clock signal generation unit to receive a first strobe signal and a second strobe signal to generate a clock signal to be provided to the processor, and a data reception unit to receive at least one data signal to provide the received data signal to the processor, wherein the clock signal generation unit may comprise a strobe comparator to compare a voltage of a first input terminal with a voltage of a second input terminal to output logic high or logic low according to the result of comparison, a first switch to selectively connect one of a first signal line by which the first strobe signal is transmitted and a reference line by which a reference voltage is provided from the data reception unit, to the first input terminal, a second switch to selectively connect one of a second signal line by which the second strobe signal is transmitted and the reference line, to the second input terminal, and a voltage stabilizing circuit to pull up or pull down a voltage of the first signal line or a voltage of the second signal line.

The clock signal generation unit may control the first switch and the second switch so that the reference line is connected to only one of the first input terminal and the second input terminal.

The voltage stabilizing circuit may comprise a plurality of pull-up/pull-down units, each of the plurality of pull-up/pull-down units having a pull-up resistor and pull-down resistor having different resistance values from the others, and pulling up or pulling down at least one of the voltage of the first signal line and the voltage of the second signal line by using one of the plurality of pull-up/pull-down units according to a predetermined operation mode.

The foregoing and/or other features and utilities of the present general inventive concept may also be achieved by providing a semiconductor device, including a clock signal generation unit configured to generate a clock signal based on a differential signal received as a strobe signal including a first strobe signal and a second strobe signal, the clock signal generation unit comprising a first voltage stabilizing unit configured to generate a logic high or a logic low when a difference between the first strobe signal and the second strobe signal is below a predetermined value, and a processor configured to control operation of the first voltage stabilizing unit.

The first voltage stabilizing unit may comprise a first pull-up/pull-down unit configured to selectively pull up or pull down at least one of the first and second strobe signals to a high or low logic level through a first resistance, and a second pull-up/pull-down unit configured to selectively pull up or pull down at least one of the first and second strobe signals to a high or low logic level through a second resistance different from the first resistance.

The processor may be configured to activate or deactivate the first pull-up/pull-down unit and/or the second pull-up/pull-down unit according to an operation frequency of the strobe signal.

The first resistance may be greater than the second resistance.

The clock signal generation unit may further comprise a comparator having a first input terminal and a second input terminal and configured to output a high level or low level logic signal based on a comparison of voltage of each of signals received at the first and second input terminals, a first switch configured to selectively transmit one of the first strobe signal, the second strobe signal, and a reference voltage signal to the first input terminal, and a second switch configured to selectively transmit either the second strobe signal or the reference voltage signal to the second input terminal.

The semiconductor device may further comprise a data reception unit configured to receive at least one input data signal and to provide an output data signal to the processor.

The processor may sample the output data signal provided from the data reception unit according to the clock signal.

The data reception unit may comprise a comparator to compare the input data signal to a reference voltage signal, and a second voltage stabilizing unit to stabilize a voltage of the output data signal.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE EMBODIMENTS

Figure 1:
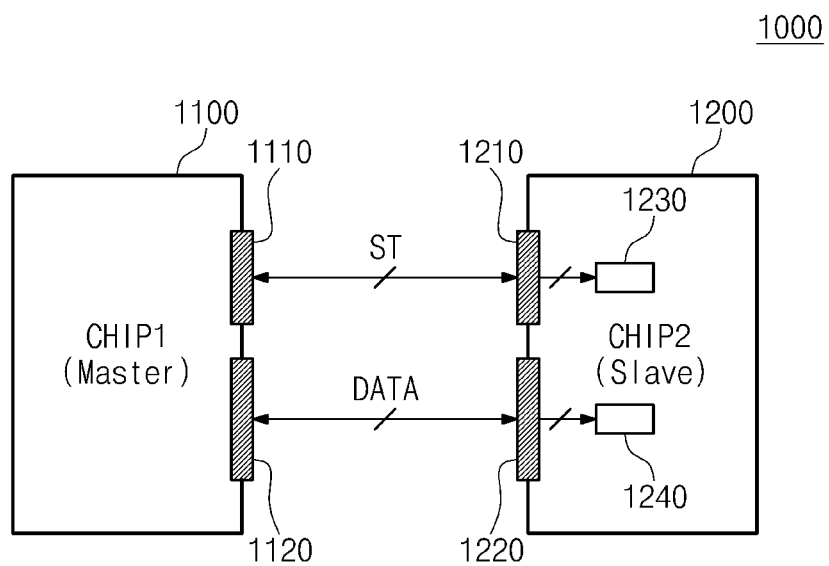
FIG. 1 is a drawing illustrating a semiconductor system including a semiconductor device according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

This present general inventive concept may be embodied in many different forms and should not be construed as limited to the embodiments set forth herein. Rather, these embodiments are provided so that this disclosure will be thorough and complete, and will fully convey the scope of the present general inventive concept to those skilled in the art. In the drawings, the size and relative sizes of layers and regions may be exaggerated for clarity.

The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

FIG. 1 illustrates a semiconductor system 1000 including a semiconductor device 1200 in accordance with the present general inventive concept.

Referring to FIG. 1, a semiconductor system 1000 may include a first semiconductor device 1100 and a second semiconductor device 1200. The second semiconductor device 1200 may include a clock signal generation unit 1230 and a data reception unit 1240 in accordance with the present general inventive concept. This is only an exemplary illustration and the first semiconductor device 1100 may also include a clock signal generation unit 1230.

The first semiconductor device 1100 may act as a master device in the semiconductor system 1000. The first semiconductor device 1100 provides data DATA and a strobe signal ST to the second semiconductor device 1200. The data DATA may include a command for controlling an operation of the second semiconductor device 1200. The strobe signal ST is a signal for determining a sampling timing of data DATA being transmitted from the first semiconductor device 1100. In the present general inventive concept, the first semiconductor device 1100 provides a differential signal to the semiconductor device 1200 as the strobe signal ST.

The second semiconductor device 1200 may act as a slave device in the semiconductor system 1000. The second semiconductor device 1200 receives the strobe signal ST being transmitted from the first semiconductor device 1100 to generate a clock signal. The second semiconductor device 1200 samples data being transmitted from the first semiconductor device 1100 according to the generated clock signal. The second semiconductor device 1200 reads bit information of the data DATA being transmitted through a data transmission terminal 1120 from the first semiconductor device 1100 to a data terminal 1220 of the second semiconductor device 1200 on the basis of the sampled data.

In the present general inventive concept, the second semiconductor device 1200 receives a differential signal being transmitted from a strobe transmission terminal 1110 through a strobe terminal 1210 as a strobe signal ST. The differential signal is received as a strobe signal and may include at least a first strobe signal and a second strobe signal. Thus, the strobe terminal 1210 may include at least two reception terminals. The received strobe signal ST is provided to the clock signal generation unit 1230 to be used to generate a clock signal. The clock signal generation unit 1230 generates logic high '1' or logic low '0' as a clock signal depending on a difference of the differential signal (the first strobe signal and the second strobe signal) received as a strobe signal ST. The clock signal generation unit 1230 may include a voltage stabilizing circuit for generating logic high '1' or logic low '0' as a clock signal when the difference between the first strobe signal and the second strobe signal is unclear.

When a high impedance signal is received to both or one of the first strobe signal and the second strobe signal, the difference between the first strobe signal and the second strobe signal may be very small and thereby a clock signal cannot be normally generated. In this case, the clock signal generation unit 1230 may use the voltage stabilizing circuit to pull up at least one of the first strobe signal and the second strobe signal to logic high, or pull down at least one of the first strobe signal and the second strobe signal to logic low. The clock signal generation unit 1230 may therefore generate a clock signal with reference to the pulled up or pulled down signal.

Also, when two signals having the same level are received as the strobe signal ST, a difference between the two signals may be very small and thereby a clock signal cannot be normally generated. However, by comparing at least one of the two signals with a reference voltage, the clock signal generation unit 1230 can generate a clock signal.

The clock signal generation unit 1230 can pull up the first strobe signal or the second strobe signal through one of a plurality of pull-up resistors having different resistance values from each other. The clock signal generation unit 1230 may include a plurality of pull-up circuits, and may pull up the first strobe signal or the second strobe signal using one of the plurality of pull-up circuits according to an operation frequency of the strobe signal ST. A pull-up circuit using a pull-up resistor having a relatively large resistance value comparatively weakly pulls up the first strobe signal or the second strobe signal (weak pull-up). A pull-up circuit using a pull-up resistor having a relatively small resistance value comparatively strongly pulls up the first strobe signal or the second strobe signal (strong pull-up or termination pull-up). Since a strobe signal is more rapidly stabilized if a pull-up resistor having a small resistance value is used, the clock signal generation unit 1230 may pull up a strobe signal using a pull-up circuit using a pull-up resistor having a relatively small resistance value when the operation frequency is high.

Similarly, the clock signal generation unit 1230 can pull down the first strobe signal or the second strobe signal through one of a plurality of pull-down resistors having different resistance values from each other. The clock signal generation unit 1230 may include a plurality of pull-down circuits, and may pull down the first strobe signal or the second strobe signal using one of the plurality of the pull-up circuits according to an operation frequency of the strobe signal ST. A pull-down circuit using a pull-down resistor having a relatively large resistance value comparatively weakly pulls down the first strobe signal or the second strobe signal (weak pull-down). A pull-down circuit using a pull-down resistor having a relatively small resistance value comparatively strongly pulls down the first strobe signal or the second strobe signal (strong pull-down or termination pull-down). Since a strobe signal is more rapidly stabilized if a pull-down resistor having a small resistance value is used, the clock signal generation unit 1230 may pull down a strobe signal using a pull-down circuit using a pull-down resistor having a relatively small resistance value when the operation frequency is high.

According to the embodiment described above, even when a high impedance signal or a differential signal having the same level is received as the strobe signal ST, the second semiconductor device 1200 can still generate a clock signal.

The second semiconductor device 1200 can pull up or pull down the strobe signal ST using one of pull-up or pull-down resistors, each having different resistance values, according to an operation frequency of the strobe signal ST. As will be described regarding FIG. 6, the second semiconductor device 1200 can variously configure a circuit path through which the strobe signal ST is transmitted. Thus, even if an interface for transmitting the strobe signal ST is changed, the second semiconductor device 1200 can effectively deal with the change of the interface.

Figure 2:
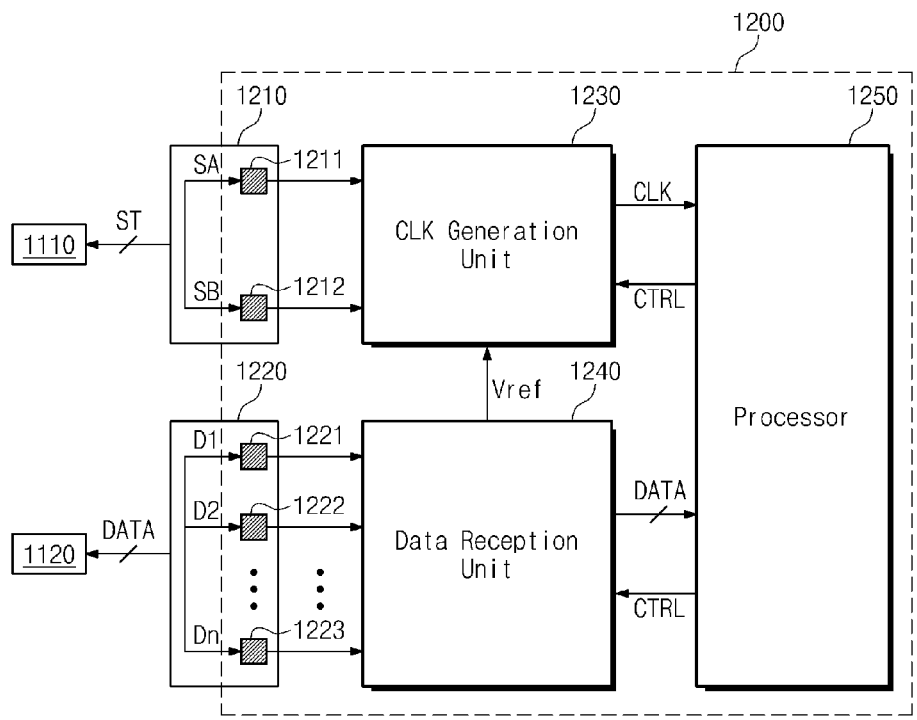
FIG. 2 is a block diagram illustrating the second semiconductor 1200 device illustrated in FIG. 1.

FIG. 2 is a block diagram illustrating the second semiconductor device 1200 illustrated in FIG. 1. Referring to FIG. 2, the second semiconductor device 1200 may include a strobe terminal 1210, a data terminal 1220, a clock signal generation unit 1230, a data reception unit 1240 and a processor 1250. Operations of the clock signal generation unit 1230 and the data reception unit 1240 may be controlled by control signals CTRL from the processor 1250.

The strobe terminal 1210 is a terminal to which a strobe signal ST is transmitted from the first semiconductor device 1100. The strobe signal ST received at the strobe terminal 1210 is transmitted to the clock signal generation unit 1230. The strobe terminal 1210 may include a plurality of sub terminals 1211 and 1212. The second semiconductor device 1200 can receive a differential signal as the strobe signal ST through the plurality of sub terminals 1211 and 1212. When a differential signal is received as the strobe signal ST, a first strobe signal SA and a second strobe signal SB constituting the differential signal are received to the sub terminals 1211 and 1212 respectively. The first strobe signal SA and the second strobe signal SB are transmitted to the clock signal generation unit 1230 through the two sub terminals 1211 and 1212.

The data terminal 1220 is a terminal to which a data signal DATA is transmitted from the first semiconductor device 1100. A data signal DATA received at the data terminal 1220 is transmitted to the data reception unit 1240. The data terminal 1220 may include a plurality of sub terminals 1221, 1222 and 1223. The second semiconductor device 1200 can receive a plurality of data through the sub terminals 1221, 1222 and 1223 individually or at the same time.

The clock signal generation unit 1230 generates a clock signal CLK according to the strobe signal ST, and provides the generated clock signal CLK to the processor 1250. The clock signal generation unit 1230 provides logic high or logic low to the processor 1250 as the clock signal CLK depending on a level difference of a differential signal being received as the strobe signal ST. If a level of the first strobe signal SA is greater than a level of the second strobe signal SB and a level difference between the first strobe signal SA and second strobe signal SB is greater than a predetermined value, the clock signal generation unit 1230 outputs logic high as the clock signal CLK. If the level of the first strobe signal SA is smaller than the level of the second strobe signal SB and a level difference between the first strobe signal SA and the second strobe signals SB is greater than a predetermined value, the clock signal generation unit 1230 outputs logic low as the clock signal CLK.

The clock signal generation unit 1230 receives the first strobe signal SA and the second strobe signal SB to output logic high or logic low depending on a level difference between the first strobe signal SA and the second strobe signal SB. In the case that the first strobe signal SA and the second strobe signal SB are high impedance signals or have the same level, the clock signal generation unit 1230 may not be able to generate the clock signal CLK properly. However, in the present general inventive concept, the second semiconductor device 1200 includes the clock signal generation unit 1230 which can generate the clock signal CLK even in the case that the first strobe signal SA and the second strobe signal SB are high impedance signals or have the same level. The clock signal generation unit 1230 according to the present general inventive concept may be configured to meet various interface protocols. For instance, the clock signal generation unit 1230 may stabilize a voltage of the strobe signal ST using a different voltage stabilizing circuit depending on a frequency of the strobe signal ST. Thus, the clock signal generation unit 1230 can actively meet a frequency change of the strobe signal ST.

The clock signal generation unit 1230 is basically configured to meet the case that both of the first strobe signal SA and the second strobe signal SB are received, but can be configured to meet the case that only one of the first strobe signal SA and the second strobe signal SB is received through an internal switching operation.

The data reception unit 1240 reads or buffers a value of the received data signal DATA to provide the read or buffered value to the processor 1250. The data reception unit 1240 can receive a plurality of data signals D1, D2 ... Dn constituting the data signal DATA through reception terminals 1221, 1222 and 1223 respectively.

The processor 1250 samples the data signal DATA being provided from the data reception unit 1240 according to the clock signal CLK being provided from the clock signal generation unit 1230. For instance, the processor 1250 may operate as a main controller of the second semiconductor device 1200. The processor 1250 may control operations of the clock signal generation unit 1230 and the data reception unit 1240.

According to the embodiment described above, the second semiconductor device 1200 can generate a clock signal even when a high impedance signal or a differential signal having the same level is received as the strobe signal ST.

Figure 3:
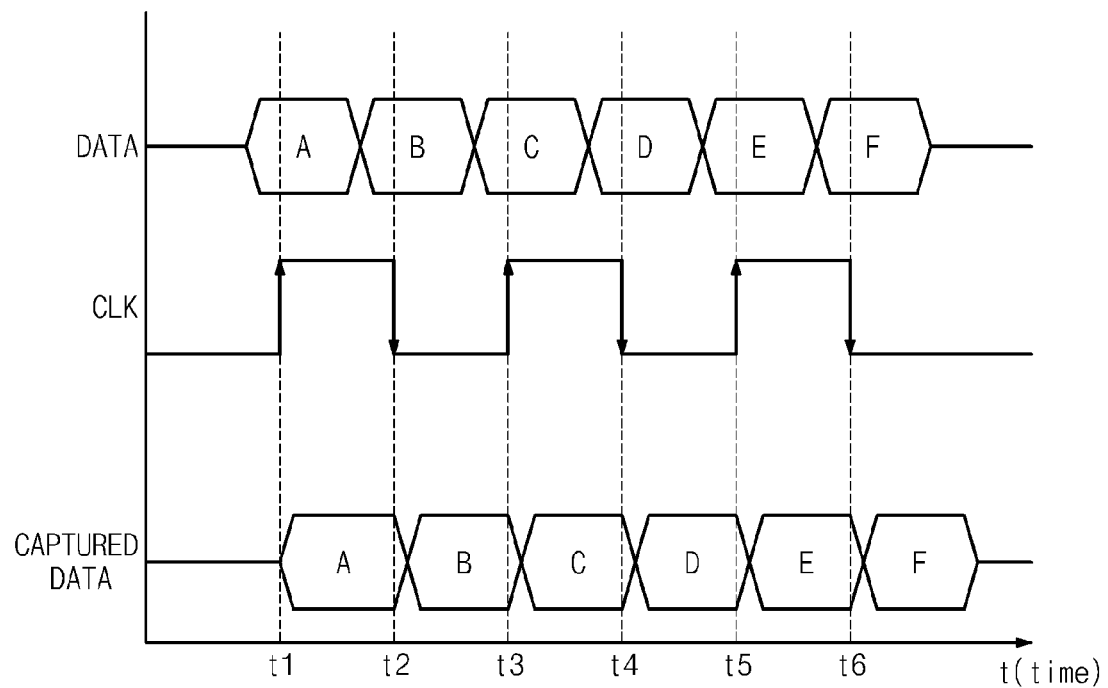
FIG. 3 is a timing diagram illustrating a method by which the processor 1250 illustrated in FIG. 2 samples a data signal DATA according to a clock signal CLK.

FIG. 3 is a timing diagram illustrating a method in which a processor 1250 samples a data signal DATA according to a clock signal CLK. Referring to FIG. 3, a data signal DATA, a clock signal CLK and a sampled signal CAPTURED DATA are all illustrated.

The data signal DATA is provided from the data reception unit 1240. The clock signal CLK is provided from the clock signal generation unit 1230. The sampled signal CAPTURED DATA represents a signal that the processor 1250 samples the data signal DATA at a specific point in time according to the clock signal CLK.

In this example, it is assumed that the processor 1250 samples the data signal DATA at a rising edge of the clock signal CLK and a falling edge of the clock signal CLK. The processor 1250 reads a value (A) of the data signal DATA as a sampled signal when the clock signal CLK rises at time (t1). The processor 1250 maintains the read value (A) until the clock signal CLK falls at time (t2). The processor 1250 reads a value (B) of the data signal DATA as a sampled signal when the clock signal CLK falls at time (t2). The processor 1250 maintains the read value (B) until the clock signal CLK rises again at time (t3).

Accordingly, the processor 1250 reads the data signal DATA in synchronization with the clock signal CLK. In this example it is assumed that the processor 1250 samples the data signal DATA at the rising edge and the falling edge. However, this is only an exemplary illustration and the processor 1250 may sample the data signal DATA, for example, at only the rising edge of the clock signal CLK instead. In such a case, the processor 1250 maintains the sampled signal from any rising edge time to a next rising edge time. Similarly, the processor 1250 may sample the data signal DATA at only the falling edge of the clock signal CLK. In this case, the processor 1250 maintains the sampled signal from any falling edge time to a next falling edge time.

Figure 4:
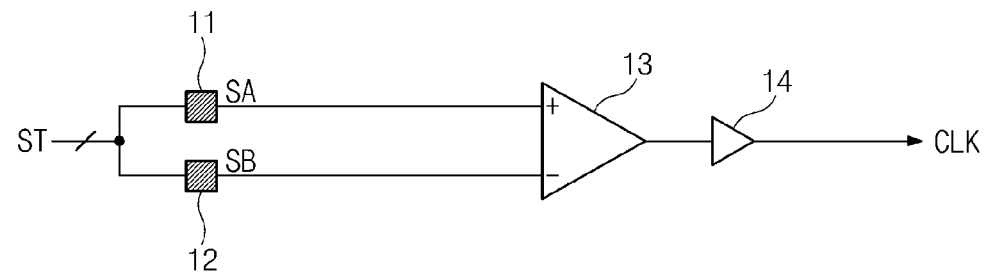
FIG. 4 is a drawing illustrating an operation of a general clock signal generation unit.
Figure 4:
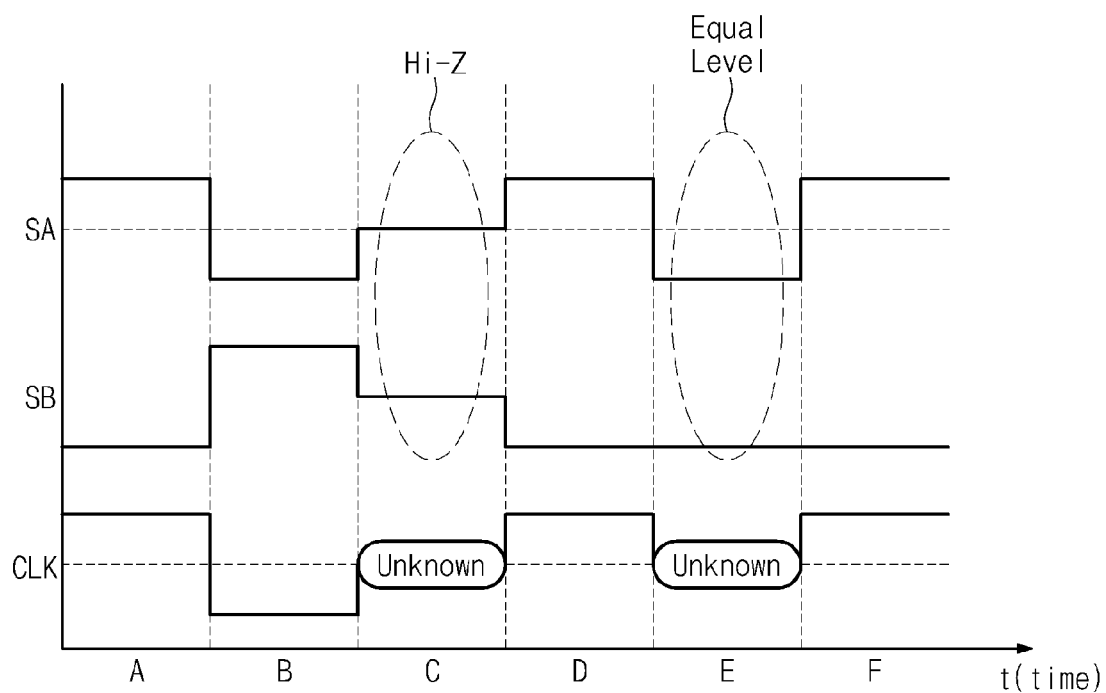

FIG. 4 is a drawing illustrating an operation of a general clock signal generation unit 10. Referring to FIG. 4, a clock signal generation unit 10 includes a comparator 13 and a buffer 14. The clock signal generation unit 10 may further include reception terminals 11 and 12 receiving a strobe signal ST.

The clock signal generation unit 10 receives a first strobe signal SA and a second strobe signal SB constituting a differential signal as a strobe signal ST. The clock signal generation unit 10 outputs logic high or logic low as a clock signal CLK depending on a level difference between the first strobe signal SA and the second strobe signal SB. A general clock signal generation unit 10 cannot reliably generate a clock signal CLK if the first strobe signal SA and the second strobe signal SB are high impedance (Hi-Z) signals, or if a level difference between the first strobe signal SA and the second strobe signal SB is 0 or smaller than a predetermined reference value.

Referring to FIG. 4, the comparator 13 outputs logic high or logic low in sections A, B, D and F where a level difference between the first strobe signal SA and the second strobe signal SB is greater than a predetermined value. However, a level difference between the first strobe signal SA and the second strobe signal SB is very small in section C, where the first and second strobe signals SA and SB are high impedance (Hi-Z) signals, and in a section E, where the first strobe signal SA and the second strobe signal SB have the same level. Thus, in the case of the sections C and E, there is no saying whether an output of the comparator 13 will become logic high or logic low, and there may be a problem in that the output of the comparator 13 is unstable.

The present general inventive concept discloses a clock signal generation unit that solves at least the problem described above.

Figure 5:
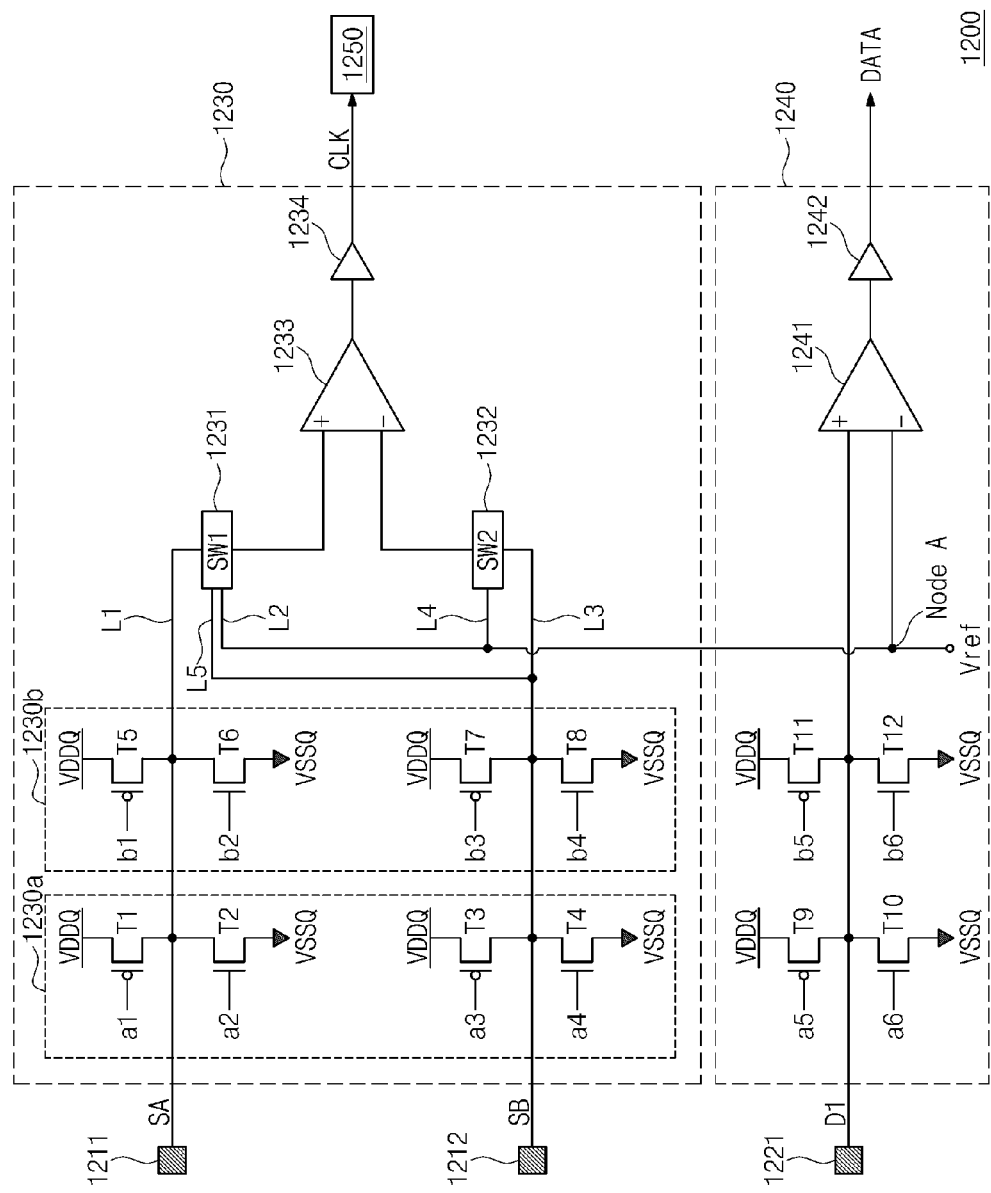
FIG. 5 is a circuit illustrating a clock signal generation unit according to an exemplary embodiment of the present general inventive concept.

FIG. 5 illustrates a clock signal generation unit 1230 in accordance with the present general inventive concept. A second semiconductor device 1200 includes a clock signal generation unit 1230, a data reception unit 1240, strobe reception terminals 1211 and 1212 and a data reception terminal 1221.

The strobe reception terminals 1211 and 1212 are terminals to which a strobe signal ST is transmitted. The strobe signal ST is transmitted to the clock signal generation unit 1230 through the strobe reception terminals 1211 and 1212.

The data reception terminal 1221 is a terminal to which a first data signal D1 of the data signal DATA is transmitted. The first data signal D1 is transmitted to the data reception unit 1240 through the data reception terminal 1221. In FIG. 5, only a transmission path of the first data signal D1 is illustrated, but the data reception unit 1240 can receive a plurality of data signals D1, D2 . . . Dn individually or in parallel through a plurality of data reception terminals 1221, 1222 and 1223 as shown in FIG. 2.

The clock signal generation unit 1230 generates a clock signal CLK with reference to the received strobe signal ST. The clock signal generation unit 1230 receives a first strobe signal SA and a second strobe signal SB constituting the strobe signal ST as a differential signal through the strobe reception terminals 1211 and 1212 respectively. The clock signal generation unit 1230 selectively transmits the first strobe signal SA to a first input terminal (+) of a strobe comparator 1233 according to an operation state of a switch SW1 1231. The clock signal generation unit 1230 selectively transmits the second strobe signal SB to the first input terminal (+) or a second input terminal (−) of the strobe comparator 1233 according to an operation state of a switch SW2 1232 and switch SW1 1231.

The clock signal generation unit 1230 includes the switches SW1 1231 and SW2 1232 connected to the strobe reception terminals 1211 and 1212, respectively. The first switch SW1 1231 connects one of a first signal line L1 connected to the first strobe reception terminal 1211, a fifth signal line L5 connected to the second strobe reception terminal 1212, and a second signal line L2 connected to a reference node (node A) to the first input terminal (+) of the strobe comparator 1233. The second switch SW2 1232 connects one of a third signal line L3 connected to the second strobe reception terminal 1212 and a fourth signal line L4 connected to the reference node (node A) to the second input terminal (−) of the strobe comparator 1233. The switches SW1 1231 and SW2 1232 are controlled so that the first (+) and second (−) input terminals of the strobe comparator 1233 are not connected to the reference node (node A) at the same time. For instance, when the first switch SW1 1231 connects the second signal line L2 to the first input terminal (+) of the strobe comparator 1233, the second switch SW2 is controlled to connect the third signal line L3 to the second input terminal (−) of the strobe comparator 1233.

The clock signal generation unit 1230 may compare one of the received differential signal SA and SB with a node voltage (Vref, hereinafter referred to as a reference voltage) of the reference node to generate a clock signal CLK when levels of the received differential signal SA and SB are the same. Thus, even if levels of the received strobe signals SA and SB are the same, the clock signal generation unit 1230 can generate the clock signal CLK by comparing the first strobe signal SA or the second strobe signal SB with the reference voltage Vref.

Since in the embodiment shown the reference voltage Vref for the comparison is provided from the data reception unit 1240 through the fourth signal line L4, the clock signal generation unit 1230 need not include a separate reference voltage generator.

The clock signal generation unit 1230 includes voltage stabilizing circuits 1230a and 1230b. The clock signal generation unit 1230 can pull up or pull down a voltage of the first signal line L1 or a voltage of the third signal line L3 by the voltage stabilizing circuits 1230a and 1230b. The voltage stabilizing circuits of the clock signal generation unit 1230 may include a weak pull-up/pull-down unit 1230a and a termination pull-up/pull-down unit 1230b.

The weak pull up/pull down unit 1230a pulls up or pulls down a voltage of the first signal line L1 or the third signal line L3 using a pull-up or pull-down resistor having a relatively large resistance value. Thus, the weak pull-up/pull-down unit 1230a may be used when a frequency of the strobe signal ST is relatively low. Whereas, the termination pull-up/pull-down unit 1230b pulls up or pulls down a voltage of the first signal line L1 or the third signal line L3 using a pull-up or pull-down resistor having a relatively small resistance value. Since the termination pull up/pull down unit 1230b using the pull-up or pull-down resistor having a relatively small resistance value has a small delay due to a signal change as compared with the weak pull-up/pull-down unit 1230a, the termination pull-up/pull-down unit 1230b is better suited to receive a strobe signal ST having a high frequency.

The weak pull-up/pull-down unit 1230a may include a first transistor T1 for pulling up the first signal line L1, a second transistor T2 for pulling down the first signal line L1, a third transistor T3 for pulling up the third signal line L3 and a fourth transistor T4 for pulling down the third signal line L3. The first and third transistors T1 and T3 operate as a pull-up switch and the second and fourth transistors T2 and T4 operate as a pull-down switch. When the first and third transistors T1 and T3 are turned on, the first and third signal lines L1 and L3 are pulled up. When second and fourth transistors T2 and T4 are turned on, the first and third signal lines L1 and L3 are pulled down. An equivalent resistor of the first, second, third and fourth transistors T1, T2, T3 and T4 becomes a pull-up resistor or a pull-down resistor of the weak pull-up/pull-down unit 1230a. When the first transistor T1 is turned on, the first signal line L1 is pulled up to a voltage VDDQ using an equivalent resistor of the first transistor T1 as a pull-up resistor. Similarly, when the second transistor T2 is turned on, the first signal line L1 is pulled down to a voltage VSSQ using an equivalent resistor of the second transistor T2 as a pull-down resistor.

Turn-on or turn-off of the switch transistors T1, T2, T3 and T4 is determined according to levels of control signals a1, a2, a3 and a4 being provided to respective gate terminals of the switch transistors T1, T2, T3 and T4. The levels of the control signals a1, a2, a3 and a4 may be controlled by the processor 1250.

In this embodiment, a pull-up or pull-down resistor of the weak pull-up/pull-down unit 1230a comprises an equivalent resistor of the switch transistors T1, T2, T3 and T4, but the present general inventive concept is not limited thereto. The weak pull-up/pull-down unit 1230a may further include one or more additional pull-up or pull-down resistors. In this case, the whole pull-up or pull-down resistor of the weak pull-up/pull-down unit 1230a is the same as the sum of the additional pull-up or pull-down resistor(s) and the equivalent resistor of the switch transistors T1, T2, T3 and T4.

The termination pull-up/pull-down unit 1230b may include a fifth transistor T5 for pulling up the first signal line L1, a sixth transistor T6 for pulling down the first signal line L1, a seventh transistor T7 for pulling up the third signal line L3 and an eighth transistor T8 for pulling down the third signal line L3. The fifth and seventh transistors T5 and T7 operate as a pull-up switch and the sixth and eighth transistors T6 and T8 operate as a pull-down switch. When the fifth and seventh transistors T5 and T7 are turned on, the first and third signal lines L1 and L3 are pulled up. When the sixth and eight transistors T6 and T8 are turned on, the first and third signal lines L1 and L3 are pulled down. An equivalent resistor of the fifth, sixth, seventh and eight transistors T5, T6, T7 and T8 becomes a pull-up resistor or a pull-down resistor of the termination pull up/pull down unit 1230b. When the fifth transistor T5 is turned on, the first signal line L1 is pulled up to a voltage VDDQ using an equivalent resistor of the fifth transistor T5 as a pull-up resistor. Similarly, when the sixth transistor T6 is turned on, the first signal line L1 is pulled down to a voltage VSSQ using an equivalent resistor of the sixth transistor T6 as a pull-down resistor.

Similar to the weak pull-up/pull-down unit 1230a, turn-on or turn-off of the switch transistors T5, T6, T7 and T8 is determined according to levels of control signals b1, b2, b3 and b4 being provided to respective gate terminals of the switch transistors T5, T6, T7 and T8. The levels of the control signals b1, b2, b3 and b4 may be controlled by the processor 1250.

In this embodiment, a pull-up or pull-down resistor of the termination pull-up/pull-down unit 1230b comprises an equivalent resistor of the switch transistors T5, T6, T7 and T8, but the present general inventive concept is not limited thereto. The termination pull-up/pull-down unit 1230b may further include one or more additional pull-up or pull-down resistors. In this case, the whole pull-up or pull-down resistor of the termination pull-up/pull-down unit 1230b is the same as the sum of the additional pull-up or pull-down resistor(s) and the equivalent resistor of the switch transistors T5, T6, T7 and T8.

The strobe comparator 1233 compares the first input terminal (+) with the second input terminal (−) to output logic high or logic low according to a result of comparison. If a level difference between the first input terminal (+) and the second input terminal (−) is more than a predetermined value, the strobe comparator 1233 outputs logic high or logic low. For example, if a voltage level of the first input terminal (+) is greater than a voltage level of the second input terminal (−) by a predetermined value or more, the strobe comparator 1233 outputs logic high. If a voltage level of the first input terminal (+) is smaller than a voltage level of the second input terminal (−) by a predetermined value or more, the strobe comparator 1233 outputs logic low.

The strobe buffer 1234 buffers an output of the strobe comparator 1233. The buffered output is provided to the processor 1250 as a clock signal CLK.

The data reception unit 1240 receives a data signal D1 being transmitted through the data reception terminal 1221 to compare the data signal D1 with the reference voltage Vref. The data reception unit 1240 outputs logic high or logic low according to a result of comparison. For instance, if a level of the data signal D1 is greater than a level of the reference voltage Vref, the data reception unit 1240 outputs logic high. If the level of the data signal D1 is smaller than the level of the reference voltage Vref, the data reception unit 1240 outputs logic low.

The data reception unit 1240 may include a data comparator 1241 for comparing the received data signal D1 with the reference voltage Vref. The data reception unit 1240 may further include a data buffer 1242 for buffering an output of the data comparator 1241. The data reception unit 1240 may further include a voltage stabilizing circuit for stabilizing a voltage of the data signal D1. The voltage stabilizing circuit may include a plurality of switch transistors T9, T10, T11 and T12 for pulling up or pulling down the data signal D1. Each of the switch transistors T9, T10, T11 and T12 may be turned on or turned off according to control signals a5, a6, b5 and b6. The control signals a5, a6, b5 and b6 may be controlled by the processor 1250.

In the present embodiment, one data signal D1 is shown as input to the data reception unit 1240, but this is only an exemplary illustration and the data reception unit 1240 may receive a plurality of data signals as illustrated in FIG. 2. The plurality of data signals may be received, for example, through a data bus.

According to the embodiment described above, even when a high impedance signal or a differential signal having the same level is received as the strobe signal ST, the second semiconductor device 1200 can still generate a clock signal. The second semiconductor device 1200 can stabilize a voltage level of the strobe signal ST using a pull-up/pull-down unit optimized for a specific operation frequency of the strobe signal ST. For example, since the weak pull-up/pull-down unit 1230a has low impedance (i.e., high pull-up/pull-down resistance), it may be relatively vulnerable to surrounding noises. And, when a switch of the weak pull-up/pull-down unit 1230a is turned on or turned off, a voltage transition of a signal line may take a long time. Thus, in a communication interface requiring a rapid operation speed, the termination pull-up/pull-down unit 1230b having relatively high impedance (i.e., low pull-up/pull-down resistance) may be used.

On the other hand, since the termination pull-up/pull-down unit 1230b has low pull-up/pull-down resistance, the termination pull-up/pull-down unit 1230b may have a disadvantage in that its power consumption is higher as compared with the weak pull-up/pull-down unit 1230a. Thus, in a device in which power reduction is a main technical issue, it may be advantageous to pull up or pull down the strobe signal ST using the weak pull-up/pull-down unit 1230a. The second semiconductor device 1200 has an advantage of being capable of selecting the weak pull-up/pull-down unit 1230a or the termination pull-up/pull-down unit 1230b as necessary. Thus, the second semiconductor device 1200 can properly deal with various types of devices or various interface methods.

Figure 6:
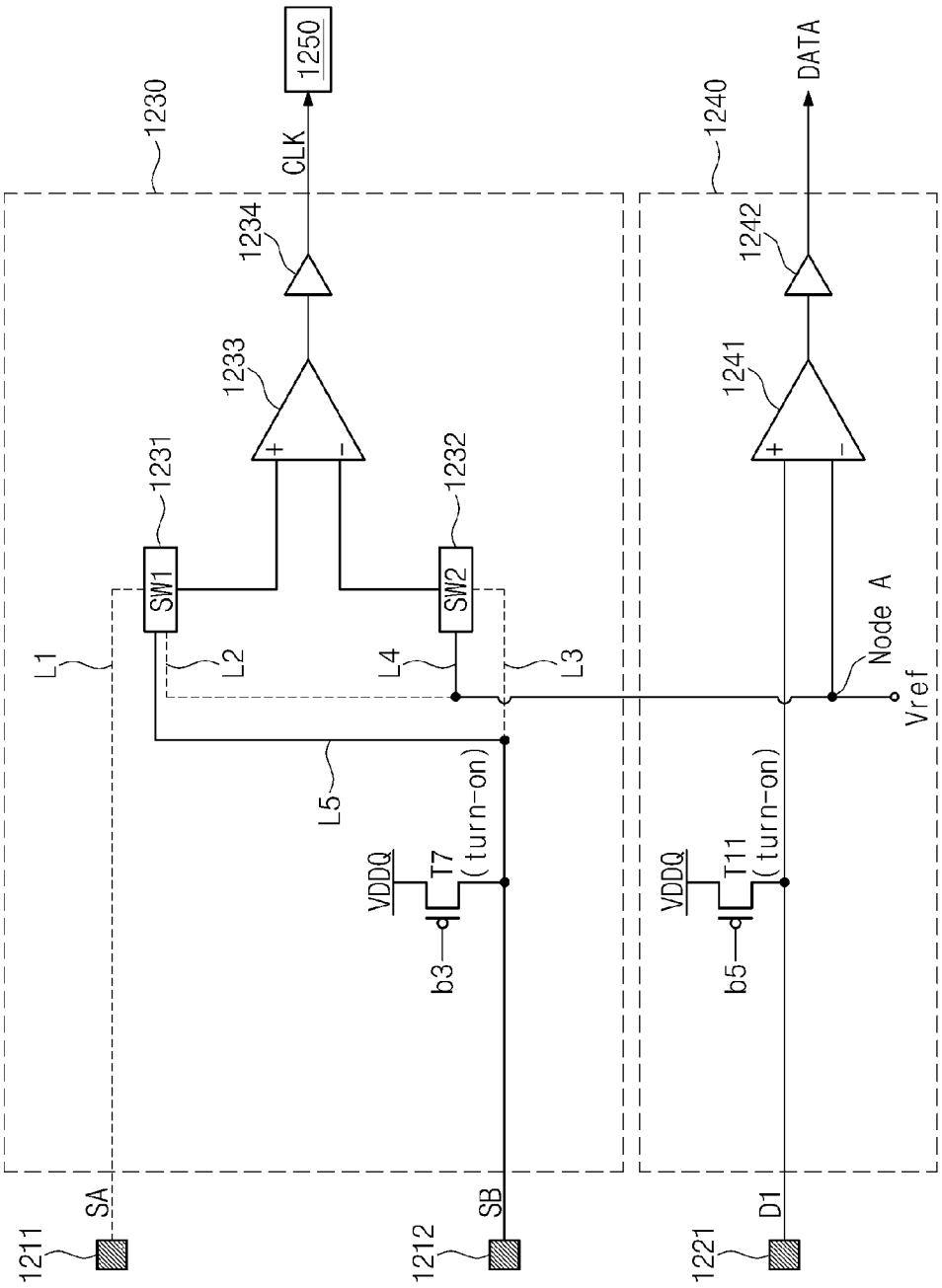
FIG. 6 is a drawing illustrating a configuration of the clock signal generator 1230 illustrated in FIG. 5.

FIG. 6 illustrates a configuration setting of the clock signal generator 1230 illustrated in FIG. 5. The clock signal generator 1230 is configured such that the first switch SW1 1231 connects one of the first signal line L1 and the fifth signal line L5 to the first input terminal (+) of the strobe comparator 1233. In preparation for an operation frequency of the second strobe signal SB being high, the clock signal generator 1230 is configured such that the fifth signal line L5 is termination-pulled up by the seventh switch transistor T7. At this time, the second switch SW2 1232 connects the fourth signal line L4 to the second input terminal (−) of the strobe comparator 1233 for comparison with the second strobe signal SB.

The strobe comparator 1233 compares a voltage level of the first input terminal (+) with a voltage level of the second input terminal (−). If the voltage level of the first input terminal (+) is greater than the voltage level of the second input terminal (−) by a predetermined value or more, the strobe comparator 1233 outputs logic high. If the voltage level of the first input terminal (+) is smaller than the voltage level of the second input terminal (−) by a predetermined value or more, the strobe comparator 1233 outputs logic low.

The strobe buffer 1234 buffers an output of the strobe comparator 1233 to provide the buffered output to the processor 1250 as a clock signal CLK.

According to the configuration described above, the clock signal generator 1230 compares the voltage level of the second strobe signal SB with the reference voltage Vref to generate the clock signal CLK. Thus, even if the first strobe signal SA and the second strobe signal SB have a same voltage level, the clock signal generator 1230 can still generate the clock signal CLK.

The clock signal generator 1230 pulls up the fifth signal line L5 to which the second strobe signal SB is transmitted. Thus, even if a high impedance signal is transmitted as the second strobe signal SB, the clock signal generator 1230 can still generate the clock signal CLK. Since the clock signal generator 1230 termination-pulls up the fifth signal line L5, the clock signal generator 1230 can react more rapidly to the second strobe signal SB which has a high frequency compared to using the weak-pull up.

Figure 7:
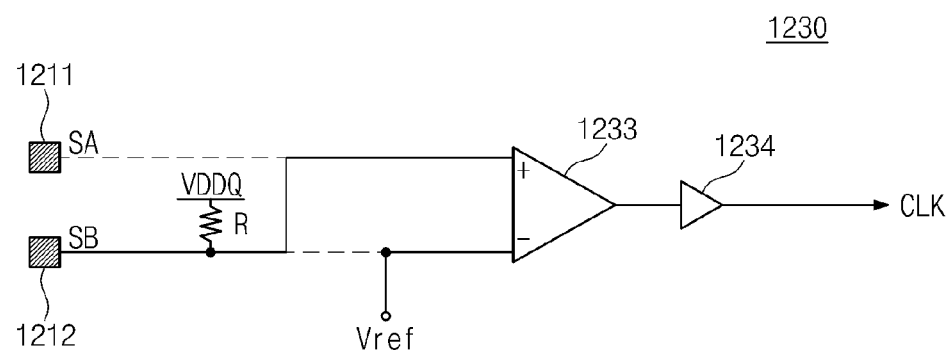
FIG. 7 is a timing diagram illustrating an operation of the clock signal generator 1230 configuration illustrated in FIG. 6.
Figure 7:
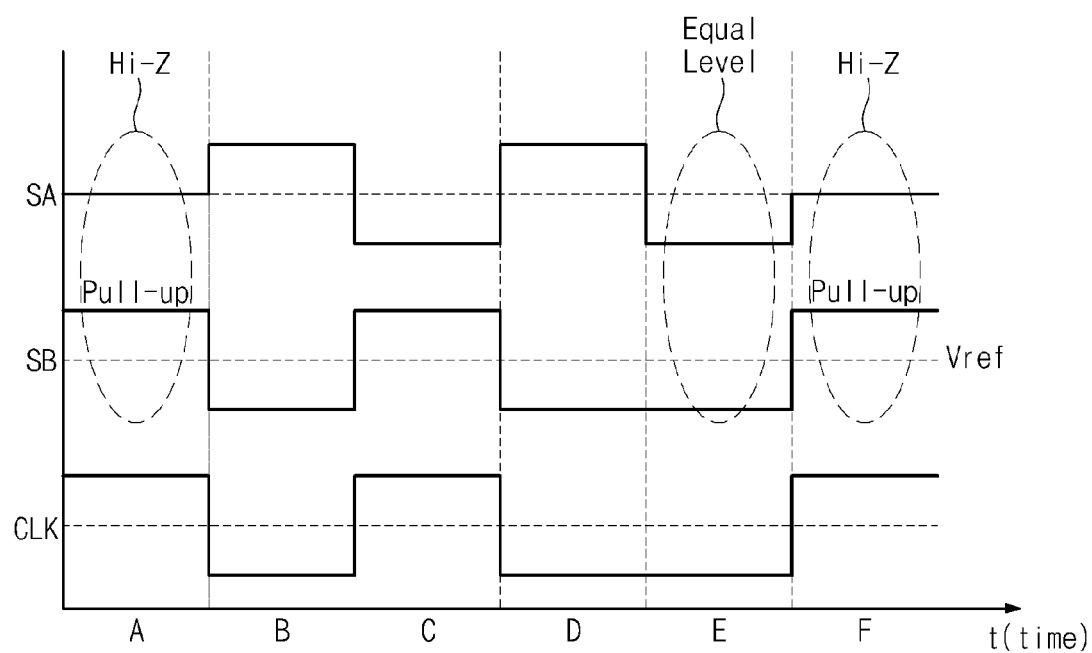

FIG. 7 illustrates an operation of the clock signal generator 1230 configuration shown in FIG. 6. In FIG. 7, a simplified circuit diagram illustrating the clock signal generator 1230 and a timing diagram of the first strobe signal SA, the second strobe signal SB and the generated clock signal CLK are shown.

In the clock signal generator 1230, in accordance with the configuration shown in FIG. 6, a pulled-up second strobe signal SB is applied to the first input terminal (+) of the strobe comparator 1233. The reference voltage Vref is applied to the second input terminal (−) of the strobe comparator 1233. The strobe comparator 1233 outputs logic high or logic low according to a value obtained by subtracting a level of the reference voltage Vref from a voltage level of the second strobe signal SB applied to the first input terminal (+). The output logic high or logic low is buffered by the strobe buffer 1234 to be provided as the clock signal CLK.

In the timing diagram of FIG. 7, a change of the clock signal CLK according to the voltage level of the first strobe signal SA and the second strobe signal SB is illustrated. In FIG. 7, the strobe comparator 1233 compares the voltage level of the second strobe signal SB with the reference voltage reference Vref. Thus, the clock signal is affected only by a voltage level change of the second strobe signal SB and is not directly affected by a voltage level change of the first strobe signal SA.

In sections A, C and F, in which the level of the second strobe signal SB is greater than the level of the reference voltage Vref, the clock signal CLK becomes logic high. Whereas, in sections B, D and E, in which the level of the second strobe signal SB is smaller than the level of the reference voltage Vref, the clock signal CLK becomes logic low. In the present embodiment, the clock signal CLK is generated through a comparison of the level of the second strobe signal SB with the level of the reference voltage Vref. Thus, even in the section E, in which the first strobe signal SA and the second strobe signal SB have the same voltage level, the clock signal CLK is still generated. In the present configuration, the second strobe signal SB is termination-pulled up. Thus, even in the sections A and F in which a high impedance signal is received as the second strobe signal SB, the clock signal CLK is still generated.

Figure 8:
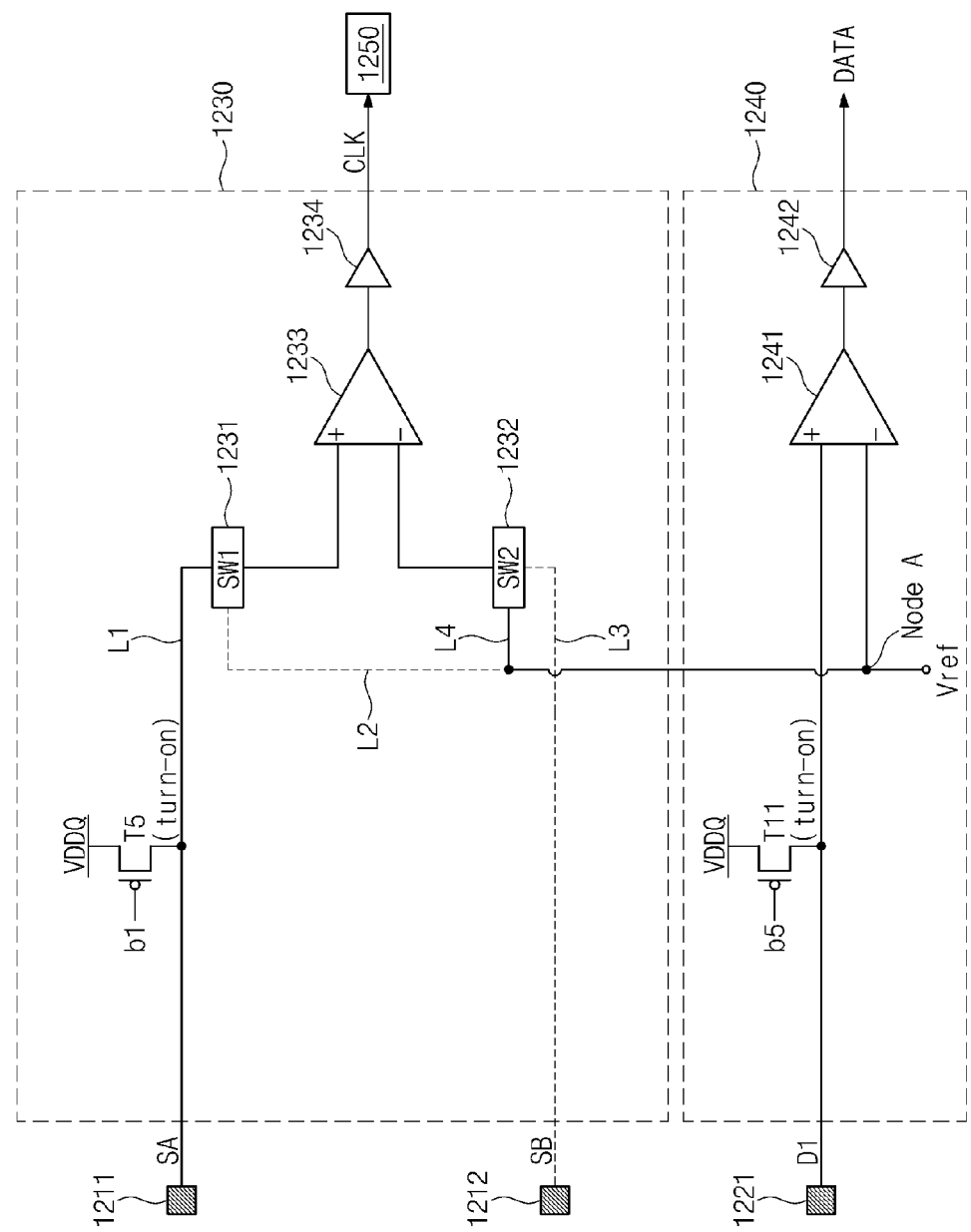
FIG. 8 is a drawing illustrating another configuration of the clock signal generator 1230 illustrated in FIG. 5.

FIG. 8 illustrates another configuration setting of the clock signal generator 1230 illustrated in FIG. 5. In FIG. 8, the clock signal generator 1230 is configured such that the first switch SW1 1231 connects the first signal line L1 to the first input terminal (+) of the strobe comparator 1233. In preparation for an operation frequency of the first strobe signal SA being high, the clock signal generator 1230 is configured such that the first signal line L1 is termination-pulled up by the fifth switch transistor T5. At this time, the second switch SW2 1232 connects the fourth signal line L4 to the second input terminal (−) of the strobe comparator 1233 for comparing the reference voltage Vref with the first strobe signal SA.

The strobe comparator 1233 compares a voltage level of the first input terminal (+) with a voltage level of the second input terminal (−). If the voltage level of the first input terminal (+) is greater than the voltage level of the second input terminal (−) by a predetermined value or more, the strobe comparator 1233 outputs logic high. If a voltage level of the first input terminal (+) is smaller than a voltage level of the second input terminal (−) by a predetermined value or more, the strobe comparator 1233 outputs logic low.

The strobe buffer 1234 buffers an output of the strobe comparator 1233 to provide the buffered output to the processor 1250 as a clock signal CLK.

According to the configuration described above, the clock signal generator 1230 compares the voltage level of the first strobe signal SA with the level of the reference voltage Vref to generate the clock signal CLK. Thus, even if the first strobe signal SA and the second strobe signal SB have the same voltage level, the clock signal generator 1230 can still generate the clock signal CLK.

The clock signal generator 1230 pulls up the first signal line L1 to which the first strobe signal SA is transmitted. Thus, even if a high impedance signal is transmitted as the first strobe signal SA, the clock signal generator 1230 can still generate a clock signal CLK. Since the clock signal generator 1230 termination-pulls up the first signal line L1, the clock signal generator 1230 can react more rapidly to the first strobe signal SA, which has a high frequency, compared to using a weak-pull up.

Figure 9:
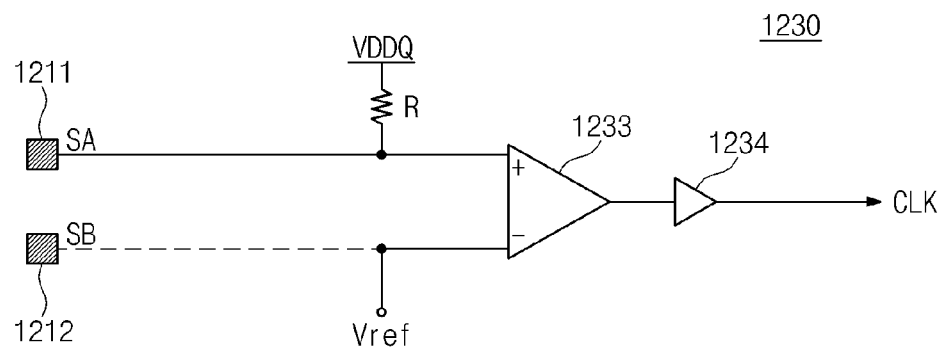
FIG. 9 is a timing diagram illustrating an operation of the clock signal generator 1230 configuration illustrated in FIG. 8.
Figure 9:
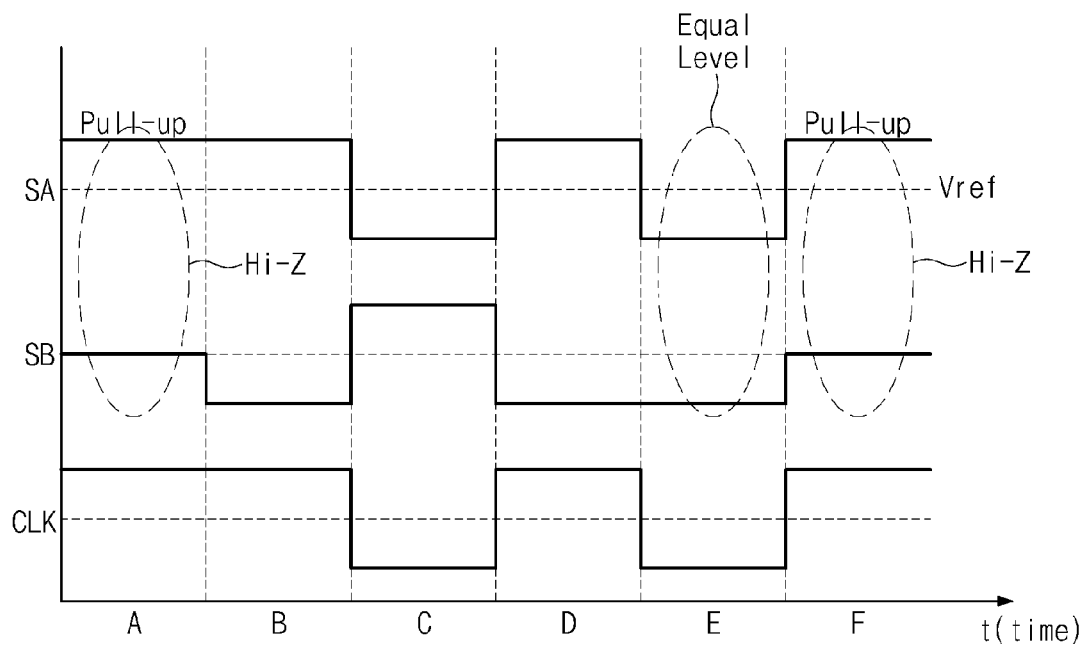

FIG. 9 illustrates an operation of the clock signal generator 1230 configuration shown in in FIG. 8. In FIG. 9, a simplified circuit diagram illustrating the clock signal generator 1230 and a timing diagram of the first strobe signal SA, the second strobe signal SB and the generated clock signal CLK are shown.

In the clock signal generator 1230 in accordance with the configuration shown in FIG. 8, a pulled-up first strobe signal SA is applied to the first input terminal (+) of the strobe comparator 1233. The reference voltage Vref is applied to the second input terminal (−) of the strobe comparator 1233. The strobe comparator 1233 outputs logic high or logic low according to a value obtained by subtracting a level of the reference voltage Vref from a voltage level of the first strobe signal SA applied to the first input terminal (+). The output logic high or logic low is buffered by the strobe buffer 1234 to be provided as the clock signal CLK.

In the timing diagram of FIG. 9, a change of the clock signal according to the voltage level of the first strobe signal SA and the second strobe signal SB is illustrated. In FIG. 9, the strobe comparator 1233 compares the voltage level of the first strobe signal SA with the level of the reference voltage Vref. Thus, the clock signal is affected only by a voltage level change of the first strobe signal SA and is not directly affected by a voltage level change of the second strobe signal SB.

In sections A, B, D and F, in which the level of the first strobe signal SA is greater than the level of the reference voltage Vref, the clock signal CLK becomes logic high. Whereas, in sections C and E, in which the level of the first strobe signal SA is smaller than the level of the reference voltage Vref, the clock signal CLK becomes logic low. In this configuration, the clock signal CLK is generated through a comparison of the level of the first strobe signal SA with the level of the reference voltage Vref. Thus, even in section E, in which the first strobe signal SA and the second strobe signal SB have the same voltage level, the clock signal CLK is still generated. In this configuration, the first strobe signal SA is termination-pulled up. Thus, even in the sections A and F in which a high impedance signal is received as the first strobe signal SA, the clock signal CLK is still generated.

Figure 10:
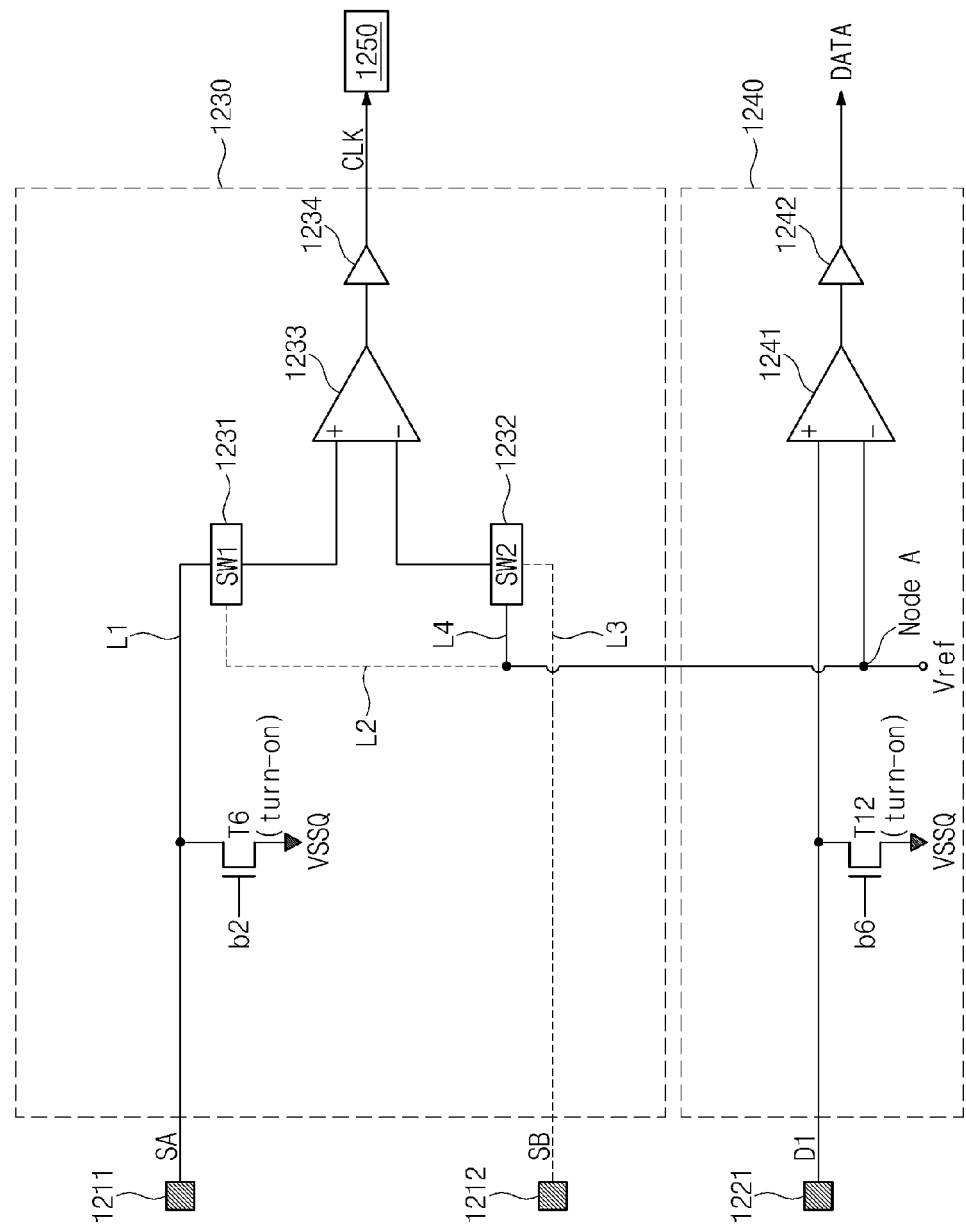
FIG. 10 is a drawing illustrating still another configuration of the clock signal generator 1230 illustrated in FIG. 5.

FIG. 10 illustrates another configuration setting of the clock signal generator 1230 illustrated in FIG. 5. In this configuration, the clock signal generator 1230 is configured such that the first switch SW1 1231 connects the first signal line L1 to the first input terminal (+) of the strobe comparator 1233. The present configuration differs from the configuration of FIG. 8 in that the first signal line L1 is pulled down. In preparation for an operation frequency of the first strobe signal SA being high, the clock signal generator 1230 is configured such that the first signal line L1 is termination-pulled down by the sixth switch transistor T6. At this time, the second switch SW2 1232 connects the fourth signal line L4 to the second input terminal (−) of the strobe comparator 1233 for comparison with the first strobe signal SA.

The strobe comparator 1233 compares a voltage level of the first input terminal (+) with a voltage level of the second input terminal (−). If the voltage level of the first input terminal (+) is greater than the voltage level of the second input terminal (−) by a predetermined value or more, the strobe comparator 1233 outputs logic high. If the voltage level of the first input terminal (+) is smaller than the voltage level of the second input terminal (−) by a predetermined value or more, the strobe comparator 1233 outputs logic low.

The strobe buffer 1234 buffers an output of the strobe comparator 1233 to provide the buffered output to the processor 1250 as a clock signal CLK.

According to the configuration described above, the clock signal generator 1230 compares the voltage level of the first strobe signal SA with the level of the reference voltage Vref to generate the clock signal CLK. Thus, even if the first strobe signal SA and the second strobe signal SB have the same voltage level, the clock signal generator 1230 can still generate the clock signal CLK.

The clock signal generator 1230 pulls down the first signal line L1 to which the first strobe signal SA is transmitted. Thus, even if a high impedance signal is transmitted as the first strobe signal SA, the clock signal generator 1230 can still generate the clock signal CLK. Since the clock signal generator 1230 termination-pulls down the first signal line L1, the clock signal generator 1230 can react more rapidly to the first strobe signal SA, which has a high frequency, compared to using a weak-pull down.

Figure 11:
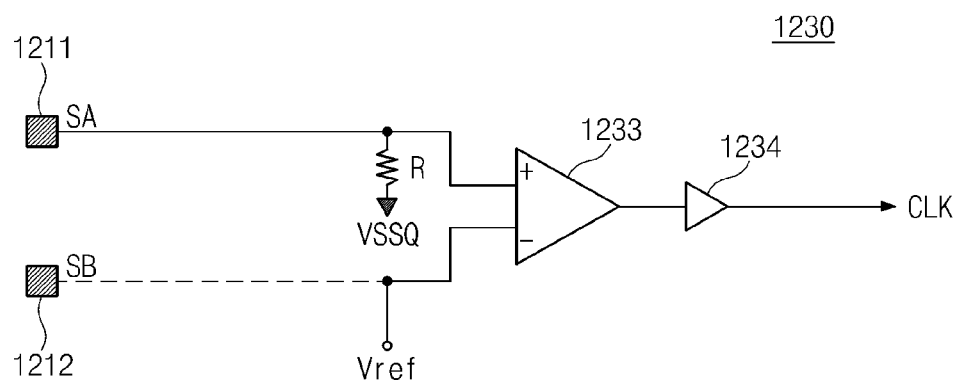
FIG. 11 is a timing diagram illustrating an operation of the clock signal generator 1230 configuration illustrated in FIG. 10.
Figure 11:
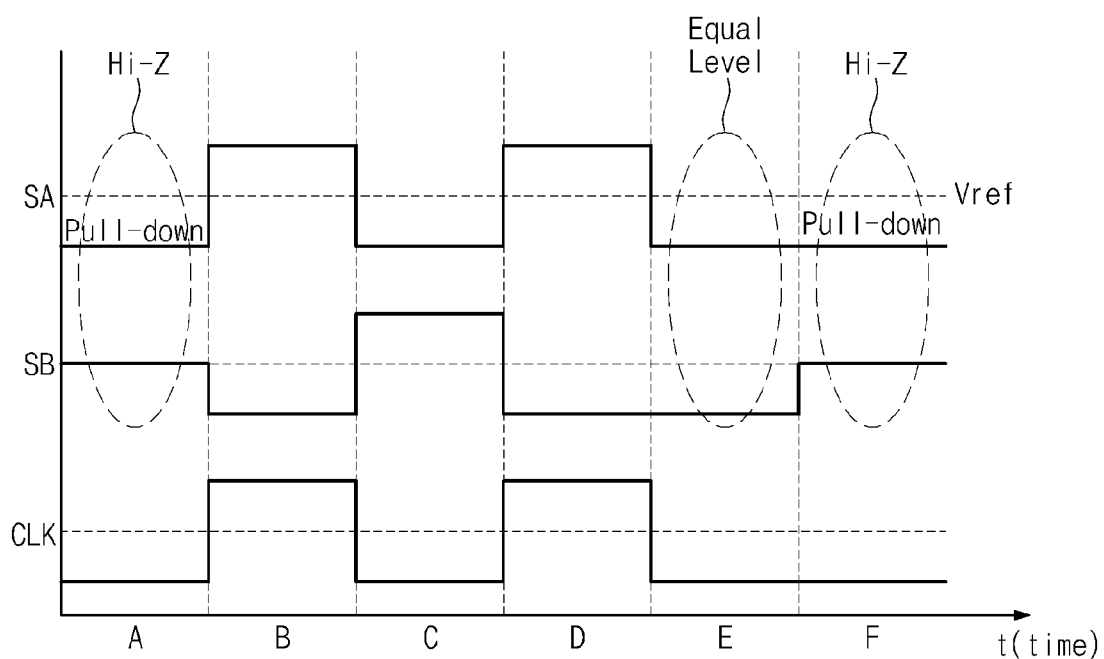

FIG. 11 illustrates an operation of the clock signal generator 1230 configuration shown in FIG. 10. In FIG. 11, a simplified circuit diagram illustrating the clock signal generator 1230 and a timing diagram of the first strobe signal SA, the second strobe signal SB and the generated clock signal CLK are shown.

In the clock signal generator 1230 in accordance with the configuration of FIG. 10, a pulled-down first strobe signal SA is applied to the first input terminal (+) of the strobe comparator 1233. The reference voltage Vref is applied to the second input terminal (−) of the strobe comparator 1233. The strobe comparator 1233 outputs logic high or logic low according to a value obtained by subtracting a level of the reference voltage Vref from a voltage level of the first strobe signal SA applied to the first input terminal (+). The output logic high or logic low is buffered by the strobe buffer 1234 to be provided as the clock signal CLK.

In the timing diagram of FIG. 11, a change of the clock signal according to the voltage level of the first strobe signal SA and the second strobe signal SB is illustrated. In FIG. 11, the strobe comparator 1233 compares the voltage level of the first strobe signal SA with the level of the reference voltage Vref. Thus, the clock signal is affected only by a voltage level change of the first strobe signal SA and is not directly affected by a voltage level change of the second strobe signal SB.

In sections B and D, in which the level of first strobe signal SA is greater than the level of the reference voltage Vref, the clock signal CLK becomes logic high. Whereas, in sections A, C, E and F, in which the level of the first strobe signal SA is smaller than the level of the reference voltage Vref, the clock signal CLK becomes logic low. In this configuration, the clock signal CLK is generated through a comparison of the level of the first strobe signal SA with the level of the reference voltage Vref. Even in the section E, in which the first strobe signal SA and the second strobe signal SB have the same voltage level, the clock signal CLK is still generated. In this configuration, the first strobe signal SA is termination-pulled down. Thus, even in the sections A and F, in which a high impedance signal is received as the first strobe signal SA, the clock signal CLK is still generated.

Figure 12:
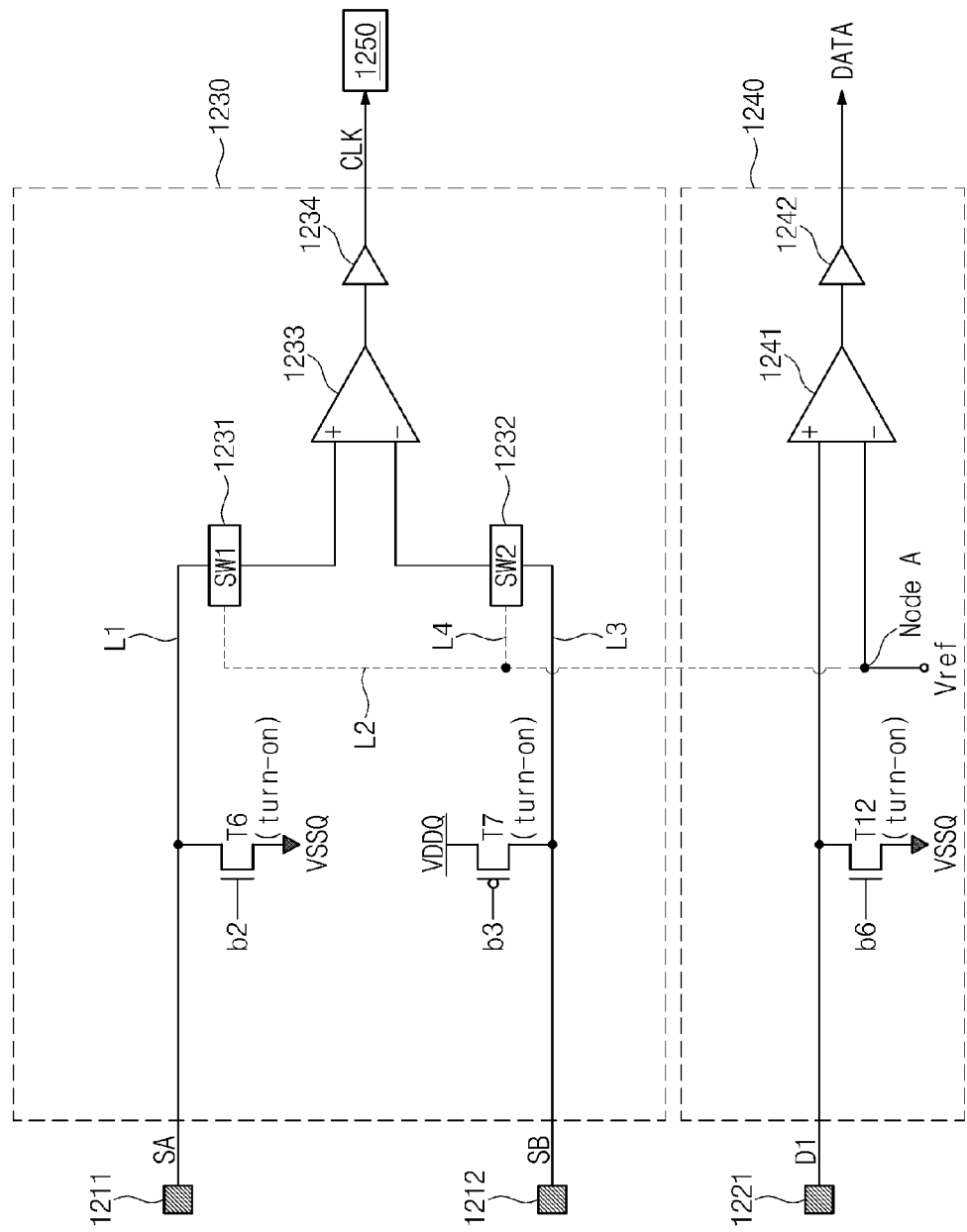
FIG. 12 is a drawing illustrating yet another configuration of the clock signal generator 1230 illustrated in FIG. 5.

FIG. 12 illustrates another configuration setting of the clock signal generator 1230 illustrated in FIG. 5. In this configuration, the clock signal generator 1230 is configured such that the first switch SW1 1231 connects the first signal line L1 to the first input terminal (+) of the strobe comparator 1233. The clock signal generator 1230 is configured such that the second switch SW2 1232 connects the third signal line L3 to the second input terminal (−) of the strobe comparator 1233.

In preparation for an operation frequency of the first strobe signal SA being high, the clock signal generator 1230 is configured such that the first signal line L1 is termination-pulled down by the sixth switch transistor T6. The clock signal generator 1230 is configured such that the third signal line L3 is termination-pulled up by the seventh switch transistor T7. In this configuration, the reference voltage Vref is not referred to for generation of a clock signal CLK. Instead, the clock signal CLK is generated according to a voltage level difference between the first strobe signal SA and the second strobe signal SB.

The strobe comparator 1233 compares a voltage level of the first input terminal (+) with a voltage level of the second input terminal (−). If the voltage level of the first input terminal (+) is greater than the voltage level of the second input terminal (−) by a predetermined value or more, the strobe comparator 1233 outputs logic high. If the voltage level of the first input terminal (+) is smaller than the voltage level of the second input terminal (−) by a predetermined value or more, the strobe comparator 1233 outputs logic low.

The strobe buffer 1234 buffers an output of the strobe comparator 1233 to provide the buffered output to the processor 1250 as the clock signal CLK.

According to the substitution described above, the clock signal generator 1230 compares the voltage level of the first strobe signal SA with the voltage level of the second strobe signal SB to generate the clock signal CLK. The first strobe signal SA and the second strobe signal SB are complementarily pulled up or pulled down by the switch transistors T6 and T7. Thus, even if a high impedance signal is transmitted as the first strobe signal SA and the second strobe signal SB, the clock signal generator 1230 can still generate the clock signal CLK. Since the clock signal generator 1230 termination-pulls up the third signal line L3 or termination-pulls down the first signal line L1, the clock signal generator 1230 can react more rapidly to the first strobe signal SA and the second strobe signal SB which have a high frequency, compared to when using a weak-pull up/pull down.

Figure 13:
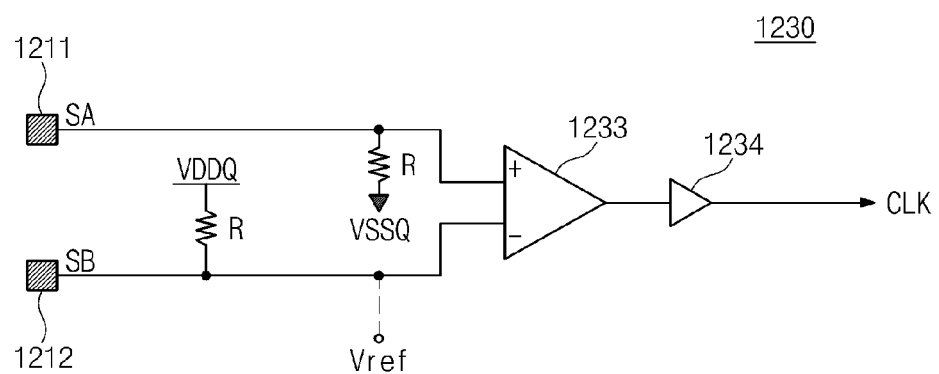
FIG. 13 is a timing diagram illustrating an operation of the clock signal generator 1230 configuration illustrated in FIG. 12.
Figure 13:
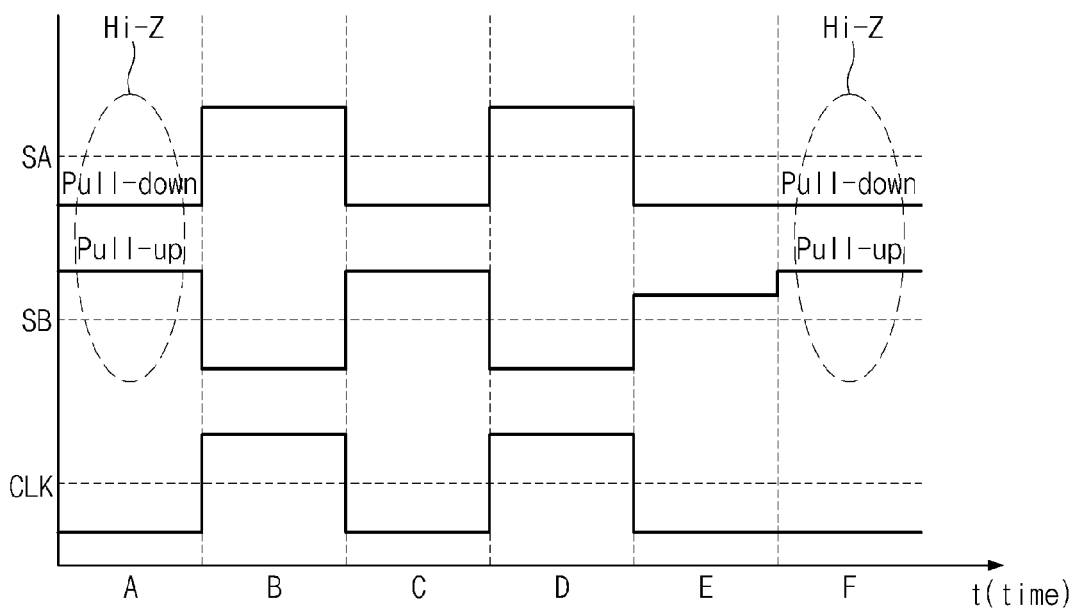

FIG. 13 illustrates an operation of the clock signal generator 1230 configuration shown in FIG. 12. In FIG. 13, a simplified circuit diagram illustrating the clock signal generator 1230 and a timing diagram of the first strobe signal SA, the second strobe signal SB and the generated clock signal CLK are shown.

In the clock signal generator 1230 in accordance with the configuration of FIG. 12, a pulled-down first strobe signal SA is applied to the first input terminal (+) of the strobe comparator 1233, and a pulled-up second strobe signal SB is applied to the second input terminal (−) of the strobe comparator 1233. The strobe comparator 1233 outputs logic high or logic low according to a value obtained by subtracting a voltage level of the second strobe signal SB applied to the second input terminal (−) from a voltage level of the first strobe signal SA applied to the first input terminal (+). The output logic high or logic low is buffered by the strobe buffer 1234 to be provided as the clock signal CLK.

In the timing diagram of FIG. 13, a change of the clock signal according to the voltage level of the first strobe signal SA and the second strobe signal SB is illustrated. In FIG. 13, the strobe comparator 1233 compares the voltage level of the first strobe signal SA with the second strobe signal SB. Thus, the clock signal is directly affected by voltage level changes of the first strobe signal SA and the second strobe signal SB.

In sections B and D in which the level of the first strobe signal SA is greater than the level of the second strobe signal SB, the clock signal CLK becomes logic high. Whereas, in sections A, C, E and F in which the level of the first strobe signal SA is smaller than the level of the second strobe signal SB, the clock signal CLK becomes logic low. In the present configuration, the first strobe signal SA may be termination-pulled down, and the second strobe signal SB may be termination-pulled up. Thus, even in the sections A and F in which a high impedance signal is received as the first strobe signal SA and the second strobe signal SB, the clock signal CLK is still generated.

Figure 14:
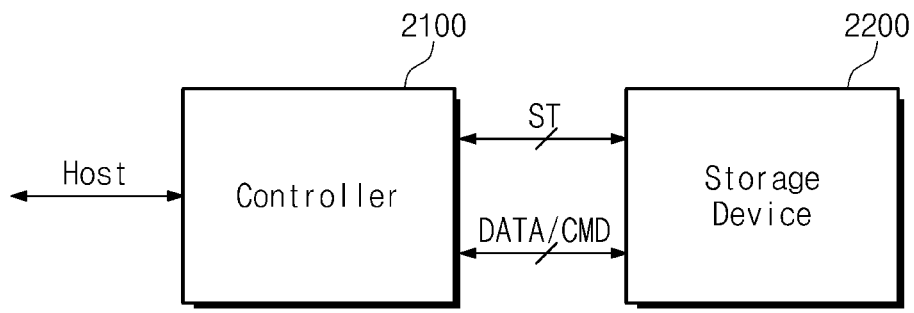
FIG. 14 is a block diagram illustrating a semiconductor memory system including a semiconductor memory device according to an exemplary embodiment of the present general inventive concept.

FIG. 14 illustrates an application example of a semiconductor memory system including a semiconductor memory device in accordance with the present general inventive concept. Referring to FIG. 14, a semiconductor memory system 2000 may include a controller 2100 and a storage device 2200. The storage device 2200 may be a flash memory device.

The controller 2100 interfaces with a host to record data in the storage device 2200 or read data stored in the storage device 2200. The controller 2100 can interface with the host through at least two channels. For instance, the controller 2100 can transmit a data signal DATA and a command signal CMD to the storage device 2200 through a first channel, and can transmit a strobe signal ST to the storage device 2200 through a second channel. The strobe signal ST is provided to the storage device 2200 to be used to generate a clock signal which the storage device 2200 refers to.

The storage device 2200 can be constituted to be the same with any one of the embodiments or configurations of the second semiconductor device 1200 described in FIGS. 1 through 13. The storage device 2200 receives the strobe signal ST from the controller 2100 to generate the clock signal. The storage device 2200 samples the data signal DATA or the command signal CMD according to the generated clock signal. The sampled value can be expressed by a binary signal. An operation and a method that the storage device 2200 generates the clock signal from the strobe signal ST and samples the data signal DATA or the command signal CMD according to the generated clock signal is the same with those described above.

According to the embodiments and configurations described above, even if a high impedance signal is transmitted as the strobe signal ST, the storage device 2200 can still generate the clock signal CLK. The storage device 2200 can also relatively rapidly react to a strobe signal ST which has a high frequency.

In FIG. 14, one controller 2100 is connected to one storage device 2200. However, this is only an exemplary illustration and one controller 2100 can be configured to control a plurality of storage devices.

A semiconductor device according to the present general inventive concept can generate a clock signal even when a high impedance signal is received as a strobe signal. Also, a semiconductor device according to the present general inventive concept can generate a clock signal even when a differential signal having the same level due to a transmission error is transmitted as a strobe signal. A semiconductor device according to the present general inventive concept can deal with a strobe signal of various types of interface.

The above-disclosed subject matter is to be considered illustrative, and not restrictive, and the appended claims are intended to cover all such modifications, enhancements, and other embodiments, which fall within the true spirit and scope of the present general inventive concept. Thus, to the maximum extent allowed by law, the scope of the present general inventive concept is to be determined by the broadest permissible interpretation of the following claims and their equivalents, and shall not be restricted or limited by the foregoing detailed description.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor device comprising:
    a processor;
    a clock signal generation unit to receive a first strobe signal and a second strobe signal to generate a clock signal to be provided to the processor; and
    a data reception unit to receive at least one data signal to provide the received data signal to the processor,
    wherein the clock signal generation unit comprises:
        a strobe comparator to compare a voltage of a first input terminal with a voltage of a second input terminal to output logic high or logic low according to a result of comparison;
        a first switch to selectively connect one of a first signal line by which the first strobe signal is transmitted and a second signal line by which the second strobe signal is transmitted, to the first input terminal;

a second switch to selectively connect one of the second signal line and a reference line to the second input terminal, the reference line being a line by which a reference voltage is transmitted from the data reception unit; and a voltage stabilizing circuit to pull up or pull down at least one of a voltage of the first signal line and a voltage of the second signal line.

2. The semiconductor device of claim 1, wherein the strobe comparator outputs logic high or logic low when a difference between the voltage of the first input terminal and the voltage of the second input terminal is greater than a predetermined value.

3. The semiconductor device of claim 1, wherein the voltage stabilizing circuit comprises a termination pull-up/pull-down unit to pull up at least one of the voltage of the first signal line and the voltage of the second signal line through a termination pull-up resistor having a predetermined resistance value, or to pull down at least one of the voltage of the first signal line and the voltage of the second signal line through a termination pull-down resistor having a predetermined resistance value, and wherein the termination pull-up/pull-down unit comprises a first pull-up switch to provide a pull-up voltage to the first signal line.

4. The semiconductor device of claim 3, wherein the termination pull-up/pull-down unit further comprises a first pull-down switch to provide a pull-down voltage to the first signal line, and wherein the first pull-up switch and the first pull-down switch are complementarily turned on.

5. The semiconductor device of claim 3, wherein the second switch connects the second signal line to the second input terminal when the reference line is not connected to the second input terminal.

6. The semiconductor device of claim 5, wherein the first switch connects the first signal line to the first input terminal when the second signal line is connected to the second input terminal.

7. The semiconductor device of claim 6, wherein the termination pull-up/pull-down unit further comprises a second pull-up switch to provide a pull-up voltage to the second signal line.

8. The semiconductor device of claim 7, wherein the voltage stabilizing circuit controls turn-on/turn-off of the first pull-up switch and the second pull-up switch in response to a control signal provided from the processor.

9. The semiconductor device of claim 3, wherein the voltage stabilizing circuit further comprises a weak pull-up/pull-down unit pulling up at least one of the voltage of the first signal line and the voltage of the second signal line through a weak pull-up resistor having a different predetermined resistance value from the termination pull-up resistor, or pulling down at least one of the voltage of the first signal line and the voltage of the second signal line through a weak pull-down resistor having a different predetermined resistance value from the termination pull-down resistor.

10. The semiconductor device of claim 9, wherein the voltage stabilizing circuit pulls up or pulls down at least one of the voltage of the first signal line and the voltage of the second signal line by using one of the termination pull-up/pull-down unit and the weak pull-up/pull-down unit according to a predetermined operation mode.

11. The semiconductor device of claim 1, wherein the clock signal generation unit further comprises a strobe buffer to buffer an output of the strobe comparator to provide the buffered output to the processor as the clock signal.

12. The semiconductor device of claim 1, wherein the processor samples a data signal provided from the data reception unit, according to the clock signal.

13. A semiconductor device comprising:
a processor;
a clock signal generation unit to receive a first strobe signal and a second strobe signal to generate a clock signal to be provided to the processor; and
a data reception unit to receive at least one data signal to provide the received data signal to the processor,
wherein the clock signal generation unit comprises:
a strobe comparator to compare a voltage of a first input terminal with a voltage of a second input terminal to output logic high or logic low according to a result of comparison;
a first switch to selectively connect one of a first signal line and a reference line to the first input terminal, the first signal line being a first line by which the first strobe signal is transmitted, and the reference line being a second line by which a reference voltage is transmitted from the data reception unit;
a second switch to selectively connect one of a second signal line and the reference line to the second input terminal, the second signal line being a third line by which the second strobe signal is transmitted; and
a voltage stabilizing circuit to pull up or pull down at least one of a voltage of the first signal line and a voltage of the second signal line.

14. The semiconductor device of claim 13, wherein the clock signal generation unit controls the first switch and the second switch so that the reference line is connected to only one of the first input terminal and the second input terminal.

15. The semiconductor device of claim 13, wherein the voltage stabilizing circuit comprises a plurality of pull-up/pull-down units, and wherein each of the plurality of pull-up/pull-down units includes pull-up resistor and pull-down resistor having different resistance values from the others, and pulls up or pulls down at least one of the voltage of the first signal line and the voltage of the second signal line by using one of the plurality of pull-up/pull-down units according to a predetermined operation mode.

16. A semiconductor device, comprising:
a clock signal generation unit configured to generate a clock signal based on a differential signal received as a strobe signal including a first strobe signal and a second strobe signal, the clock signal generation unit comprising:
a voltage stabilizing unit; and
a comparator having a first input terminal and a second input terminal and configured to output a high level or low level logic signal based on a comparison of voltage of each of signals received at the first and second input terminals;
a first switch configured to selectively transmit one of the first strobe signal, the second strobe signal, and a reference voltage signal to the first input terminal; and
a second switch configured to selectively transmit either the second strobe signal or the reference voltage signal to the second input terminal;
a processor configured to control operation of the voltage stabilizing unit,
wherein the voltage stabilizing unit comprises a first pull-up/pull-down unit configured to selectively pull up or pull down at least one of the first and second strobe signals to a high or low logic level through a first resistance, and a second pull-up/pull-down unit configured to selectively pull up or pull down at least one of the first and second strobe signals to a high or low logic level through a second resistance different from the first resistance.

17. The semiconductor device of claim 16, wherein the processor is configured to activate or deactivate the first pull-up/pull-down unit and/or the second pull-up/pull-down unit according to an operation frequency of the strobe signal.

18. The semiconductor device of claim 16, further comprising a data reception unit configured to receive at least one input data signal and to provide an output data signal to the processor.

19. The semiconductor device of claim 18, wherein the processor samples the output data signal provided from the data reception unit according to the clock signal.

* * * * *